US012674536B2

(12) United States Patent
Chen

(10) Patent No.: US 12,674,536 B2
(45) Date of Patent: Jul. 7, 2026

(54) FEMALE END ASSEMBLY AND CONNECTOR

(71) Applicant: SHENZHEN ENVICOOL INTELLIGENT CONNECTION TECHNOLOGY CO., LTD., Shenzhen (CN)

(72) Inventor: Gang Chen, Shenzhen (CN)

(73) Assignee: SHENZHEN ENVICOOL INTELLIGENT CONNECTION TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 18/997,000

(22) PCT Filed: May 13, 2024

(86) PCT No.: PCT/CN2024/092822
§ 371 (c)(1),
(2) Date: Jan. 18, 2025

(87) PCT Pub. No.: WO2024/260136
PCT Pub. Date: Dec. 26, 2024

(65) Prior Publication Data
US 2026/0036236 A1     Feb. 5, 2026

(30) Foreign Application Priority Data
Jun. 20, 2023    (CN) .......................... 202310738365.3

(51) Int. Cl.
F16L 39/04 (2006.01)
F16L 39/02 (2006.01)
H05K 7/20 (2006.01)

(52) U.S. Cl.
CPC .......... F16L 39/02 (2013.01); H05K 7/20763 (2013.01)

(58) Field of Classification Search
CPC . F16L 37/56; F16L 37/62; F16L 37/18; F16L 39/02; F16L 39/00; F16L 39/04
See application file for complete search history.

(56) References Cited

U.S. PATENT DOCUMENTS 8,807,602 B2 * 8/2014 Bohman ............... F16L 23/003
285/309

FOREIGN PATENT DOCUMENTS

CN     101859957 A     10/2010
CN     105711862 A     6/2016
(Continued)

OTHER PUBLICATIONS

International Search Report for PCT/CN2024/092822 mailed Jul. 22, 2024, ISA/CN.
(Continued)

*Primary Examiner* — Aaron M Dunwoody
(74) *Attorney, Agent, or Firm* — Yue (Robert) Xu; Apex Attorneys at Law, LLP

(57) ABSTRACT

A female end assembly is provided, including a female end used to mate, by means of plugging, with a male end forwards in a plugging direction; a connecting seat. The female end and the connecting seat are connected by centering structures, such that when the female end is subjected to an acting force perpendicular to the plugging direction, the centering structures can elastically deform to move the female end relative to the connecting seat in a direction perpendicular to the plugging direction; and a mounting seat, the connecting seat and the mounting seat are connected by means of elastic devices capable of elastically deforming in the plugging direction, such that when the female end is subjected to a backward acting force in the (Continued)

A-A plugging direction, the elastic devices can elastically deform to make the connecting seat move relative to the mounting seat in plugging direction.

14 Claims, 4 Drawing Sheets

(56) References Cited

FOREIGN PATENT DOCUMENTS

| | | | |
|---|---|---|---|
| CN | 106532303 | A | 3/2017 |
| CN | 109185582 | A | 1/2019 |
| CN | 208413098 | U | 1/2019 |
| CN | 109921235 | A | 6/2019 |
| CN | 110873252 | A | 3/2020 |
| CN | 210600597 | U | 5/2020 |
| CN | 111740279 | A | 10/2020 |
| CN | 213816604 | U | 7/2021 |
| CN | 114204157 | A | 3/2022 |
| CN | 116753375 | A | 9/2023 |
| CN | 220354745 | U | 1/2024 |
| JP | 3048310 | U | 5/1998 |
| JP | 2005129453 | A | 5/2005 |

OTHER PUBLICATIONS

The 1st Office Action dated Dec. 24, 2025 for the Chinese Patent Application No. CN202310738365.3. English Translation of the 1st Office Action.

* cited by examiner

A-A

FEMALE END ASSEMBLY AND CONNECTOR

This disclosure is a national phase application of PCT international patent application PCT/CN2024/092822, filed on May 13, 2024 which claims the priority to Chinese Patent Application No. 202310738365.3, titled "FEMALE END ASSEMBLY AND CONNECTOR", filed with the China National Intellectual Property Administration on Jun. 20, 2023, the entire disclosures of which are incorporated herein by reference.

FIELD

The present disclosure relates to the technical field of passage connection, and in particular to a female terminal assembly and a connector having the female terminal assembly.

BACKGROUND

In the existing system, a liquid cooling system applied in a data center implements a connection and disconnection solution by using a blind mating connector control system. The connector itself does not have a self-locking mechanism, and a component for installing the connector has a locking mechanism to lock the connector. Therefore, a space for manual operation can be saved, and the locking mechanism can be provided at a location with a sufficient space.

In the existing blind mating connector, when a blind mating operation is conducted between a male terminal and a female terminal, the connecting effect may be poor due to manufacturing or installation errors. Therefore, an elastic structure is generally installed at the female terminal for implementing a self-adaptive connecting.

It is found by the inventor that there are at least the following problems in the existing technologies:

The existing self-adaptive structure for the female terminal of the blind mating connector can only achieve a degree-of-freedom adjustment in four directions including upward, downward, leftward, and rightward directions. The self-adaptive adjustment range is relatively narrow, which may result in a connection failure between the male terminal and the female terminal of the blind mating connector or a connection malfunction, and thus the self-adaptive adjustment effect is poor.

Therefore, how to effectively solve the problem of the poor self-adaptive adjustment effect of the female terminal of the blind mating connector during connecting is an urgent problem for those skilled in the art.

SUMMARY

In view of above, a first object of the present disclosure is to provide a female terminal assembly, which can solve the problem of a poor the self-adaptive adjustment effect of the female terminal of the existing blind mating connector during connecting. A second object of the present disclosure is to provide a connector having the female terminal assembly described above.

In order to achieve the first object, the present disclosure provides the following technical solutions:

A female terminal assembly, including:

a female terminal, which may be used to be connected to in an insertion manner and engaged with a male terminal in an insertion direction;

a connecting seat, which is connected to the female terminal through a centering structure, the centering structure can be elastically deformed when the female terminal is subjected to a force perpendicular to the insertion direction, so that the female terminal is movable relative to the connecting seat in a direction perpendicular to the insertion direction; and a mounting seat, which is connected to the connecting seat by an elastic device that is elastically deformable in the insertion direction, so that, when the female terminal is subjected to a backward force in the insertion direction, the elastic device is elastically deformed to move the connecting seat relative to the mounting seat in the insertion direction.

For the female terminal assembly, in use, the female terminal is connected to in an insertion manner and engaged with the male terminal in the frontward direction and in the insertion direction. In the insertion and engagement process, in case that the female terminal is eccentric with the male terminal, the female terminal can force the centering structure to be elastically deformed under the external force or the lateral force exerted by the male terminal in the corresponding direction, so that the position of the female terminal can be adjusted in that direction until the male terminal is aligned with the female terminal. As the insertion is completed, when the female terminal has a tendency to continue moving under the external force, the female terminal transmits the force to the elastic device, and the elastic device is deformed, so that the female terminal can move backward to damp the impact force and can be returned in a forward direction when the external force is removed. In the female terminal assembly, both the centering structure and the elastic device are provided, so that the position of the female terminal can be adjusted in both the insertion direction and the direction perpendicular to the insertion direction, and thus the self-adaptive adjustment range is high. Moreover, the centering structure and the elastic device are provided separately to prevent the port of the female terminal from tilting in the position adjustment process, ensuring the insertion reliability and a better self-adaptive adjustment effect. In summary, the female terminal assembly can effectively solve the problem of a poor self-adaptive adjustment effect of the female terminal of the existing blind mating connector during insertion.

In an embodiment, the elastic device includes a compression spring, which is abutted between the connection seat and the mounting seat, and the connecting seat and the mounting seat are limited with each other by a locking screw rod to keep the compression spring in a compressed state.

In an embodiment, a tail portion of the locking screw rod passes through the mounting seat from a side of the mounting seat away from the connecting seat and is threadedly connected to the connecting seat; and a head of the locking screw rod abuts against the side of the mounting seat away from the connecting seat.

In an embodiment, the compression spring is provided on the locking screw rod.

In an embodiment, at least one of the mounting seat and the connecting seat has an accommodation groove for accommodating an end portion of the compression spring.

In an embodiment, the centering structure is positioned in a direction perpendicular to the insertion direction by a self-centering spring; the connecting seat has a positioning hole, the female terminal has a positioning rod inserted into the positioning hole, the self-centering spring is provided on and is matched with the positioning rod, and an outer side of the self-centering spring is matched with a wall of the positioning hole.

In an embodiment, the positioning rod is exposed and forms an external port on a rear side of the connecting seat; and a central portion of the positioning rod forms a communication passage in communication with a port of the female terminal.

In an embodiment, the female terminal is provided with a guide hole for guiding an insertion of the male terminal; and the positioning rod is threadedly connected to a locking nut on the rear side of the connecting seat.

In an embodiment, the female terminal has two ports, which are arranged on left and right sides in parallel, and the female terminal has two corresponding positioning rods; and two elastic devices are arranged at each of the left and right ends of the connecting seat to be in a rectangular distribution.

In order to achieve the second object, a connector is provided in the present disclosure, including the female terminal assembly according to any one of describe above and a male terminal. The male terminal is connected to in an insertion manner and engaged with the female terminal of the female terminal assembly. Since the female terminal assembly described above has the technical efforts above, the connectors having the female terminal assembly should also has those technical efforts.

BRIEF DESCRIPTION OF THE DRAWINGS

In order to clearly illustrate the embodiments of the present disclosure or the technical solutions in the prior art, a brief introduction will be given to the accompanying drawings required for the description of the embodiments or the prior art. It is obvious that the accompanying drawings described below are only some embodiments of the present disclosure. For those skilled in the art, other drawings can be obtained based on these drawings without paying creative work.

Figure 1:
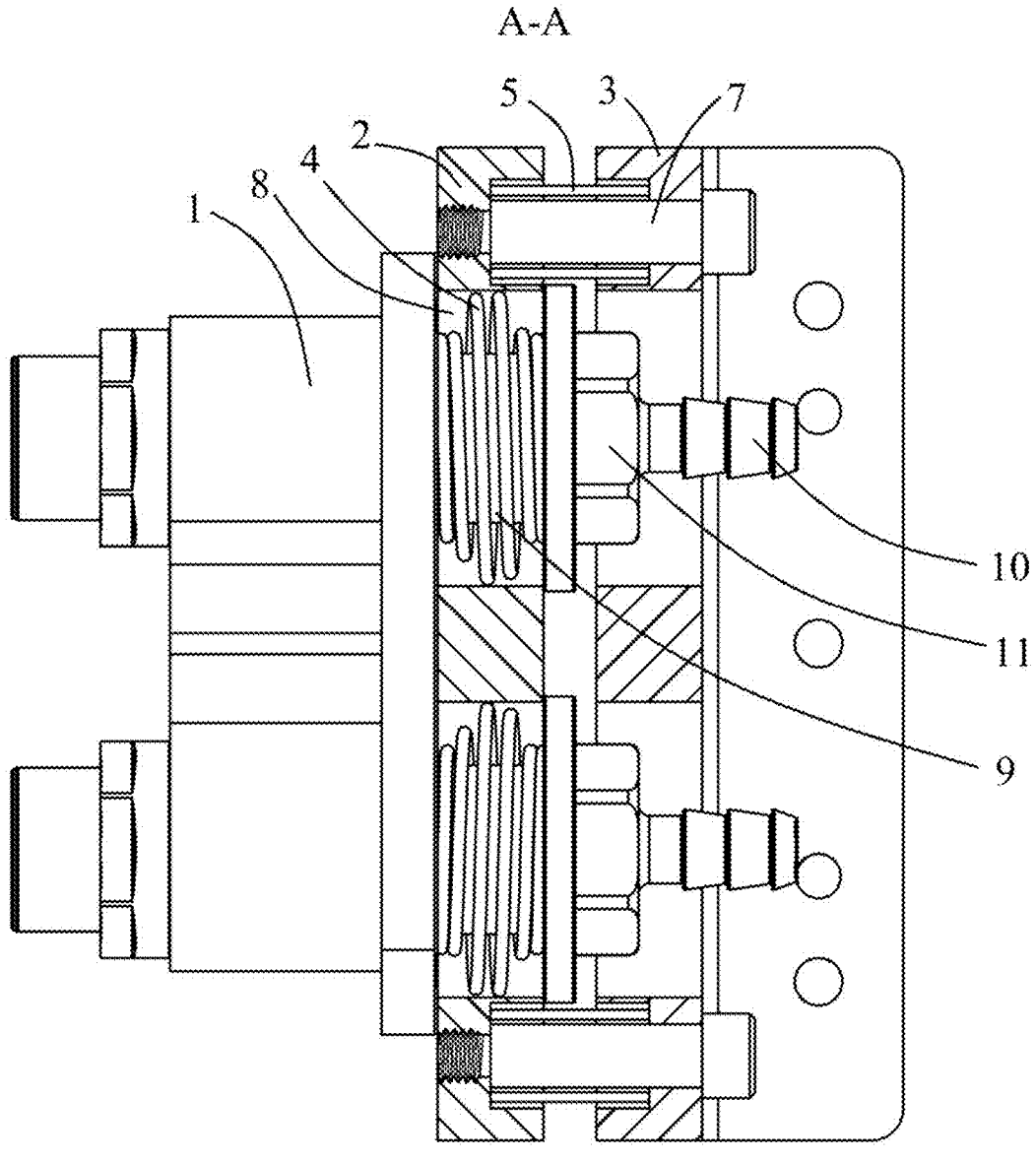
FIG. 1 is a schematic structural view of a female terminal assembly according to an embodiment of the present disclosure, in which a connecting seat and a mounting seat are sectioned along a line A-A in FIG. 2.

Numeral references in the accompany drawings:

Female terminal 1, connecting seat 2, mounting seat 3, centering structure 4, elastic device 5, locking screw rod 7, positioning hole 8, positioning rod 9, external port 10, locking nut 11, guide hole 12, guide rod 13, male terminal 14.

Detail Portion Ed Description of the Embodiments

A female terminal assembly is provided in the embodiments of the present disclosure, which can solve the problem of a poor self-adaptive adjustment effect of the female terminal of the existing blind mating connector during connecting.

Hereinafter, the technical solutions in the embodiments of the present disclosure will be clearly and completely described in conjunction with the accompanying drawings. Obviously, the described embodiments are only a part of the embodiments of the present disclosure, not all of them. Based on the embodiments of the present disclosure, all other embodiments obtained by those skilled in the art without paying creative work will fall within the scope of the present disclosure.

Figure 2:
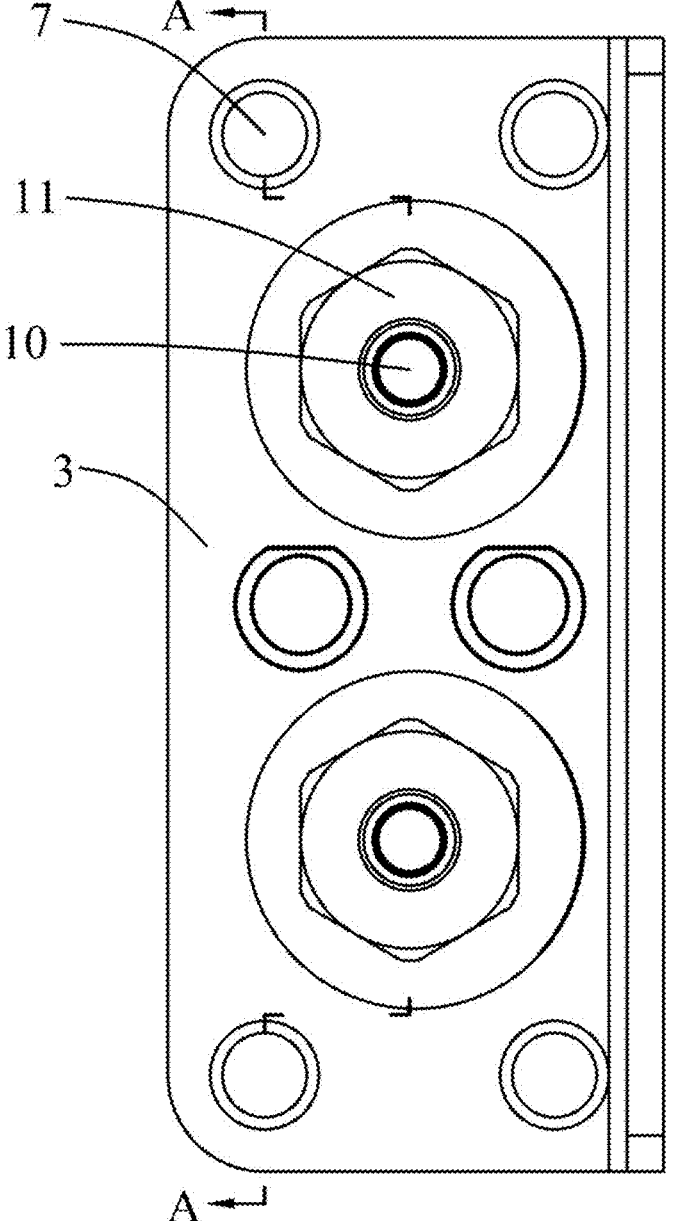
FIG. 2 is a schematic structural view of a rear side of the female terminal assembly according to an embodiment of the present disclosure.
Figure 3:
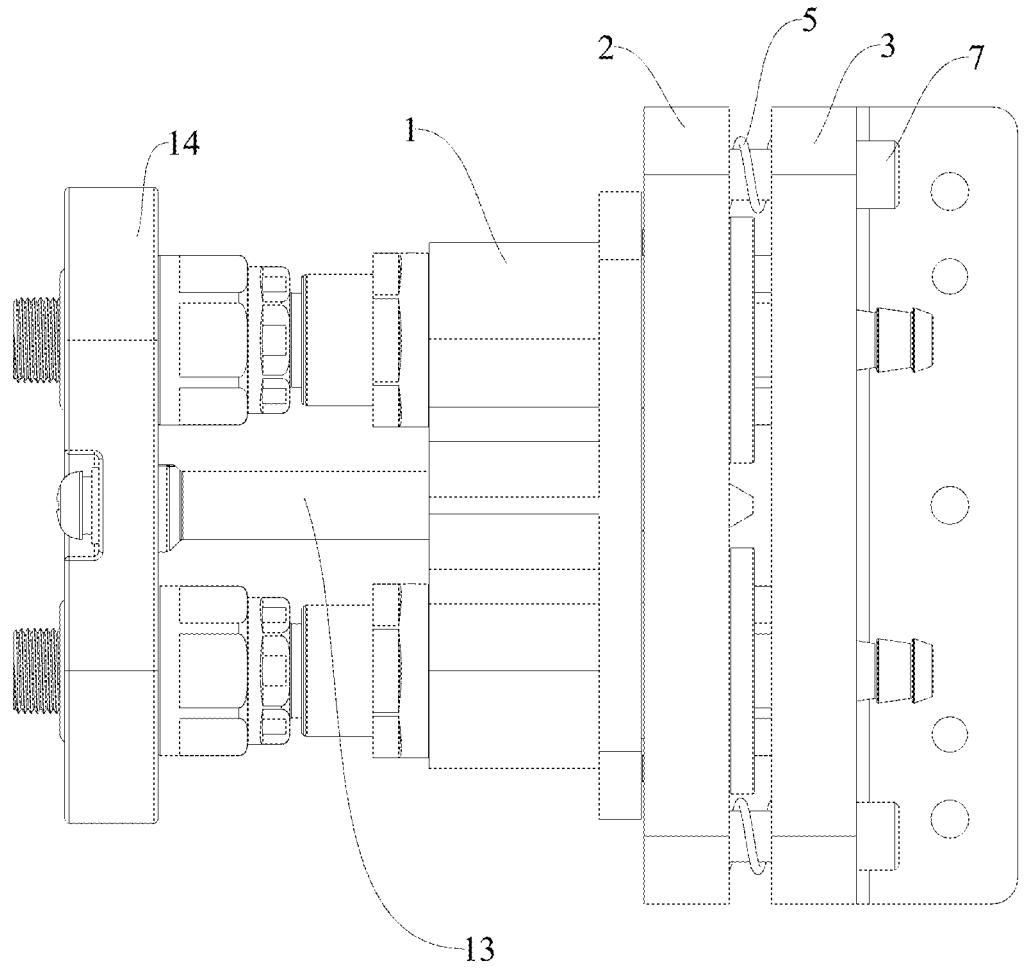
FIG. 3 is a schematic structural view of a connector according to an embodiment of the present disclosure after a male terminal and the female terminal are connected with each other.
Figure 4:
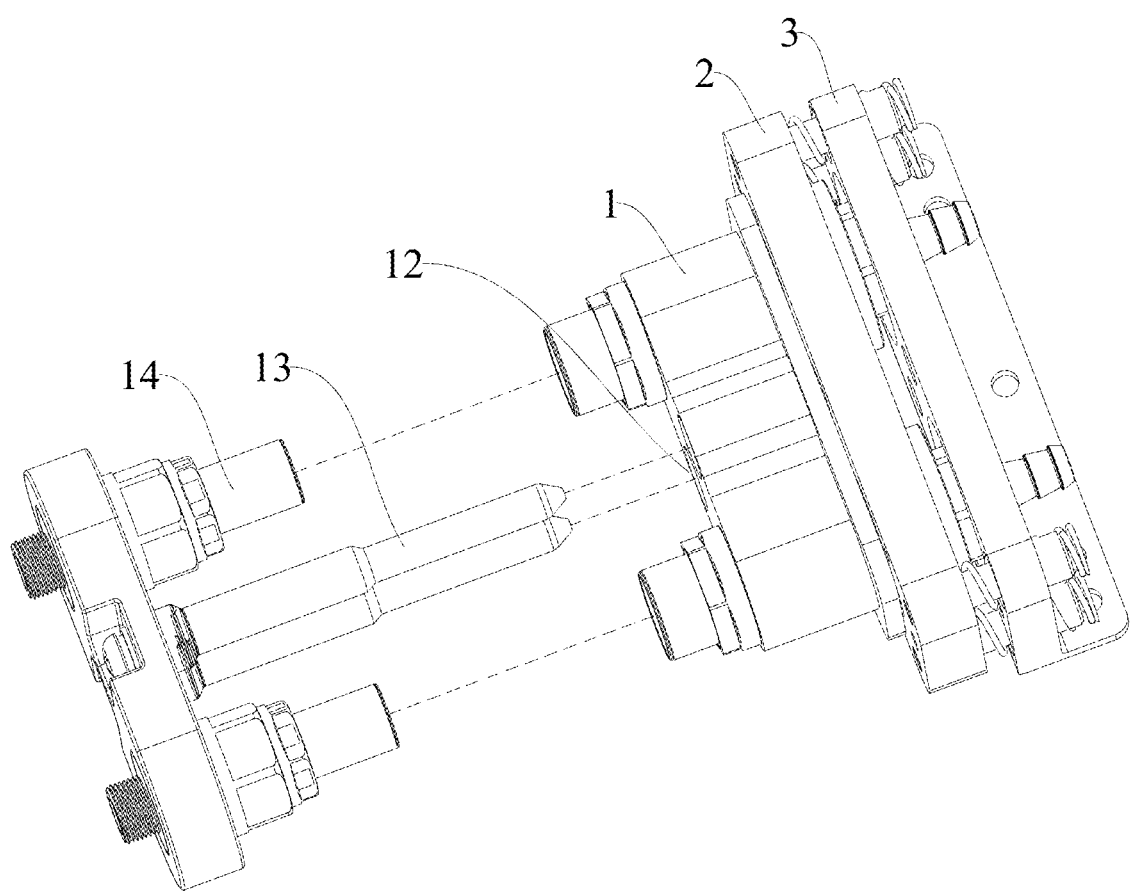
FIG. 4 is a schematic structural view of the connector according to an embodiment of the present disclosure during connecting between the male terminal and the female terminal.
Figure 5:
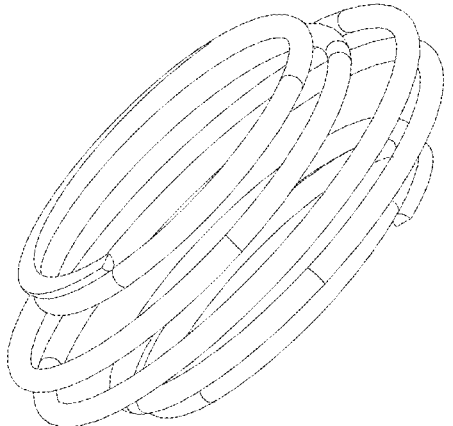
FIG. 5 is a schematic structural view of a self-centering spring according to an embodiment of the present disclosure.

Refer to FIG. 1 to FIG. 2, FIG. 1 is a schematic structural view of a female terminal assembly according to an embodiment of the present disclosure, FIG. 2 is a schematic structural view of a rear side of the female terminal assembly according to an embodiment of the present disclosure, FIG. 3 is a schematic structural view of a connector according to an embodiment of the present disclosure after a male terminal and the female terminal are connected with each other; FIG. 4 is a schematic structural view of the connector according to an embodiment of the present disclosure during connecting between the male terminal and the female terminal; and FIG. 5 is a schematic structural view of a self-centering spring according to an embodiment of the present disclosure.

In a specific embodiment, a female terminal assembly, as one end of a blind mating connector, is provided in this embodiment. It should be noted that, for case of understanding, two mating ends of the connector are generally referred to as a male terminal 14 and a female terminal 1, respectively. The connecting ports of the male terminal 14 and the female terminal 1 may be same or be configured to match with each other. Generally, one end has a female plug and the other end has a male plug, and there is no specific limitation on which end has a male plug and which end has a female plug.

In some embodiments, the female terminal assembly mainly includes a female terminal 1, a connecting seat 2, and a mounting seat 3. The female terminal 1 can be used to connect with the male terminal 14, and the mounting seat 3 can be used to connect with a target location for mounting the entire female terminal assembly at the target location.

Specifically, the female terminal 1 can be used to engage with the male terminal 14 in an insertion direction. Generally, the female terminal 1 is provided with the male plug and/or the female plug extending in the insertion direction. It should be noted that the connection between the male terminal 14 and the female terminal 1 here mainly refers to an insertion connection between the ports of the male terminal 14 and of the female terminal 1 so as to communicate corresponding passages. Only one passage may be provided between the female terminal 1 and the male terminal 14 for a communication or multiple passages may be provided therebetween for respective communications. The specific setting can be made as needed.

In some embodiments, the female terminal 1 and the connecting seat 2 may be connected through a centering structure 4. Through the centering structure 4, the position of the female terminal 1 can be self-adaptively adjusted relative to that of the connecting seat 2 in a direction perpendicular to the insertion direction, so that the female terminal 1 can be shifted from a state of being not aligned with the male terminal 14 to a state of being aligned with the male terminal 14. It should be noted that the position of the female terminal 1 may be adjusted relative to that of the connection seat 2 in any directions perpendicular to the insertion direction, or may be adjusted relative to that of the connection seat 2 in a single direction, for example, only in the leftward and rightward direction or in the upward and downward direction in the drawings.

For the centering structure 4, due to the elastic property of the centering structure 4, the centering structure 4 is elastically deformed when the female terminal 1 is subjected to a force perpendicular to the insertion direction, so that the female terminal 1 can move relative to the connecting seat 2 in a direction perpendicular to the insertion direction to be aligned with the male terminal 14. In the insertion process between the male terminal 14 and the female terminal 1, in an initial stage of insertion, the male terminal 14 and the female terminal 1 come into contact with each other. If the male terminal 14 is not aligned with the female terminal 1 at this time, one side of the male terminal 14 abuts against the female terminal 1 during inserting to exert a force perpendicular to the insertion direction, thereby driving the female terminal 1 to overcome the clastic force of the centering structure 4 and adjust the position of the female terminal 1 toward the direction of the force until the male terminal 14 is aligned with the female terminal 1. When the external force mentioned above is removed, for example, the male terminal 14 is pulled out, the female terminal 1 can move relative to the connecting seat 2 in the opposite direction to be returned under the elastic deformation force of the centering structure 4.

In some embodiments, the connecting seat 2 may be connected to the mounting seat 3 by an elastic device 5 that is elastically deformable in the insertion direction, so that, when the female terminal 1 is subjected to a backward force in the insertion direction, the elastic device 5 can be elastically deformed to move the connecting seat 2 relative to the mounting seat 3 in the insertion direction. It should be noted, for case of explanation, based on the orientation of the port of the female terminal 1, the orientation of the port of the female terminal 1 is referred as a forward direction, that is, the female terminal 1 can be connected with the male terminal 14 in the forward direction and in the insertion direction, and the direction opposite to the forward direction is referred as a backward direction. Therefore, in case that the front and rear positions of the female terminal 1 and the male terminal 14 are not strictly defined, when the connection between the male terminal 14 and the female terminal 1 has completed, if the female terminal 1 still has a tendency to continue moving in the direction, the force is transmitted to the female terminal 1, the connecting seat 2, and then to the elastic device 5. The elastic device 5 is elastically deformed, so that the female terminal 1 can further move appropriately to damp the impact force.

For the female terminal assembly, in use, the female terminal 1 is connected to in an insertion manner and engaged with the male terminal 14 in the frontward direction and in the insertion direction. In the insertion and engagement process, in case that the female terminal 1 is eccentric with the male terminal 14, the female terminal 1 can force the centering structure 4 to be elastically deformed under the external force or the lateral force exerted by the male terminal 14 in the corresponding direction, so that the position of the female terminal 1 can be adjusted in that direction until the male terminal 14 is aligned with the female terminal 1. As the insertion is completed, when the female terminal 1 has a tendency to continue moving under the external force, the female terminal 1 transmits the force to the clastic device 5, and the elastic device 5 is deformed, so that the female terminal 1 can move backward to damp the impact force and can be returned in the forward direction when the external force is removed. In the female terminal assembly, both the centering structure 4 and the elastic device 5 are provided, so that the position of the female terminal 1 can be adjusted in both the insertion direction and the direction perpendicular to the insertion direction. That is, the female terminal 1 can achieve a degree-of-freedom adjustment in at least six directions including the frontward, backward, upward, downward, leftward, and rightward directions, and the self-adaptive adjustment range is high. Moreover, the centering structure 4 and the elastic device 5 are provided separately to prevent the port of the female terminal 1 from tilting in the position adjustment process, ensuring the insertion reliability and a better self-adaptive adjustment effect. In summary, the female terminal assembly can effectively solve the problem of a poor self-adaptive adjustment effect of the female terminal 1 of the existing blind mating connector during insertion.

In a specific embodiment, the elastic device 5 may be a tensile elastic component or a compression elastic component. The specific setting can be made as needed. Specially, in case of the compression elastic component, a compression spring may be used, but other compression clastic components may also be used. Generally, the compression spring is used to ensure a sufficient movement stroke. When the compression spring is used, the compression spring may be arranged in the insertion direction, and two ends of the compression spring are respectively abutted against the connection seat 2 and the mounting seat 3.

In some embodiments, a constraint device may be provided between the connecting seat 2 and the mounting seat 3 to ensure that the elastic component of the elastic device 5 is in a pre-tightened state, in order to avoid an unintentional shaking of the female terminal 1 and ensure the stability of the overall structure.

In some embodiments, the elastic device 5 may include a compression spring that is abutted between the connecting seat 2 and the mounting seat 3 in the insertion direction, and the connecting seat 2 and the mounting seat 3 are limited with each other by a locking screw rod 7 to keep the compression spring in a compressed state. In some embodiments, a pre-tightened effect can be achieved by screwing the locking screw rod 7 for a certain depth. Similarly, in some embodiments, the screwing depth of the locking screw rod 7 can be varied to adjust the magnitude of the pre-tightened force.

In some embodiments, the locking screw rod 7 may be embodied as a bolt, which extends through the connecting seat 2 and the mounting seat 3 in the forward and backward directions, respectively, and the connecting seat 2 and the mounting seat 3 are then locked by the bolt.

In some embodiments, the locking screw rod 7 may be embodied as a screw, which can extends through the connecting seat 2 and be threadedly connected to the mounting seat 3, and a head of the screw abuts against a side of the connecting seat 2 away from the mounting seat 3.

In some embodiments, a tail portion of the locking screw rod 7 passes through the mounting seat 3 from a side of the mounting seat 3 away from the connecting seat 2, and is threadedly connected to the connecting seat 2. A head of locking screw rod 7 abuts against the side of the mounting seat 3 away from the connecting seat 2, so as to prevent the head of the locking screw rod 7 from interfering the installation of female terminal 1.

In some embodiments, the compression spring is provided on the locking screw rod 7. Alternatively, the compression spring may also be arranged horizontally and parallel to the locking screw rod 7.

In some embodiments, in order to better control the dimension in the insertion direction, at least one of the mounting seat 3 and the connecting seat 2 has an accommodation groove for accommodating an end portion of the compression spring. Specifically, the sides of the mounting seat 3 and the connecting seat 2 that are close to each other may be both provided with the accommodation grooves, and two ends of the compression spring are inserted into the accommodation grooves of the mounting seat 3 and the connecting seat 2, respectively.

In some embodiments, the centering structure 4 may be multiple elastic members, which are annularly distributed. For example, one compression elastic member is (or multiple compression elastic members in parallel are) arranged in each of the upward and downward directions and the leftward and rightward directions.

In some embodiments, the centering structure 4 may be positioned in a direction perpendicular to the insertion direction by a self-centering spring. The self-centering spring is generally a barrel-shaped spring, but may also be a conical spring. The difference between the self-centering spring and a cylindrical spring is that: a spiral inner diameter of the self-centering spring is gradually varied. In that case, some spiral segments of the self-centering spring have a smaller diameter, i.e., a small diameter segment, and the rest spiral segments have a larger diameter, i.e., a large diameter segment. When one side of the large diameter segment is subjected to force, the large diameter segment is elastically deformed in a radial direction.

In some embodiments, the connecting seat 2 may have a positioning hole 8, and the female terminal 1 may have a positioning rod 9 inserted into the positioning hole 8. In that case, the self-centering spring is provided on and matched with the positioning rod 9 and an outer side of the self-centering spring matches with a wall of the positioning hole 8, so that the self-centering spring is limited by the positioning hole 8 and the positioning rod 9 to mount the self-centering spring.

In some embodiments, the positioning rod 9 may be exposed and forms an external port 10 on a rear side of the connecting seat 2. A central portion of the positioning rod 9 forms a communication passage in communication with the port of the female terminal 1. In that case, the positioning rod 9 can be used as a communication pipe, which can reduce the structural weight and facilitate the rear end of the female terminal 1 of being in communication with outside. The external port 10 is a port in type of hose, which is provided with multiple annular concave portions to facilitate of fixing the hose.

In some embodiments, the female terminal 1 may be provided with a guide hole 12 for guiding the insertion of the male terminal 14, so as to implement guiding before and during the insertion process between the port of the male terminal 14 and the port of the female terminal 1. A conical guide rod 13 may be correspondingly provided on the male terminal 14. Alternatively, the guide hole 12 is provided on the male terminal 14 and the guide rod 13 is provided on the female terminal 1.

In some embodiments, the positioning rod 9 may be threadedly connected to a locking nut 11 on the rear side of the connecting seat 2, and the locking nut 11 is threadedly connected to the positioning rod 9. The locking nut 11 abuts against a side of the connecting seat 2 away from the female terminal 1 to fix the female terminal 1 with the connecting seat 2 in the insertion direction.

In some embodiments, the number of the centering structures 4 and the number of the elastic devices 5 may be set as needed, for example, one or more centering structures 4 and one or more elastic devices 5 are provided. In some embodiments, the female terminal 1 may have two ports arranged on left and right sides in parallel, and the female terminal 1 is provided with two positioning rods 9 corresponding to the two ports, respectively. In addition, two elastic devices 5 are arranged at each of the left and right ends of the connecting seat 2 so as to be in a rectangular distribution with one elastic device 5 being arranged at each of four corners of the connecting seat 2.

Based on the female terminal assembly provided in the above embodiments, a connector is further provided in the present disclosure, including the female terminal assembly in any one of the above embodiments. The connector further includes the male terminal 14, which is connected to and engaged with the female terminal 1 of the female terminal assembly. As the connector is provided with the female terminal in the above embodiments, please refer to the above embodiments for the beneficial effects of the connector.

In some embodiments, as shown in FIG. 3 and FIG. 4, a connector is provided, including a male terminal assembly and a female terminal assembly, and the female terminal assembly can refer to any one of the above embodiments. The connector can be applied to the liquid cooling system of the data center.

The male terminal assembly mainly includes the male terminal 14 and the guide rod 13. The port of the male terminal 14 may be fixedly installed on a positioning plate of the male terminal 14, which may be fixed on the liquid distributor, for example, on a manifold of the liquid distributor. The guide rod 13 may also be fixed on the positioning plate.

The female terminal assembly mainly includes the female terminal 1, the connecting seat 2, and the mounting seat 3. The female terminal 1 also includes the port and a positioning plate, and the positioning plate of the female terminal 1 is connected to the connecting seat 2 as described above. The port of the female terminal 1 and the port of the male terminal 14 are both blind mating ports. The mounting seat 3 may be an L-shaped plate. One side of the plate is used to connect to the connection seat 2, and the other side extends away from the connection seat 2 and is provided with a mounting hole to fix the female terminal assembly at the target location.

The various embodiments in the specification are described in progressive manner, and each embodiment emphasizes its differences from other embodiments. The same and similar parts between the various embodiments can be referred to each other.

The above description of the disclosed embodiments enables those skilled in the art to implement or use the present disclosure. Various modifications to these embodiments will be apparent to those skilled in the art, and the general principles defined herein can be implemented in other embodiments without departing from the spirit or scope of the present disclosure. Therefore, the present disclosure will not be limited to the embodiments shown herein, but will be within the widest scope consistent with the principles and features disclosed herein.

The invention claimed is:

1. A female terminal assembly, comprising:
   a female terminal;
   a connecting seat; and
   a mounting seat, wherein
   the female terminal is configured to be connected to in an insertion manner and engaged with a male terminal in an insertion direction;

the connecting seat is connected to the female terminal through a centering structure, the centering structure is configured to be elastically deformed when the female terminal is subjected to a force perpendicular to the insertion direction, so that the female terminal is movable relative to the connecting seat in a direction perpendicular to the insertion direction; and the connecting seat is connected to the mounting seat by an elastic device that is elastically deformable in the insertion direction, so that, when the female terminal is subjected to a backward force in the insertion direction, the elastic device is elastically deformed to move the connecting seat relative to the mounting seat in the insertion direction.

2. The female terminal assembly according to claim 1, wherein the elastic device comprises a compression spring, which is abutted between the connection seat and the mounting seat in the insertion direction; and the connecting seat and the mounting seat are limited with each other by a locking screw rod to keep the compression spring in a compressed state.

3. The female terminal assembly according to claim 2, wherein a tail portion of the locking screw rod passes through the mounting seat from a side of the mounting seat away from the connecting seat and is threadedly connected to the connecting seat; and a head of the locking screw rod abuts against the side of the mounting seat away from the connecting seat.

4. The female terminal assembly according to claim 3, wherein the compression spring is provided on the locking screw rod.

5. The female terminal assembly according to claim 4, wherein, at least one of the mounting seat and the connecting seat has an accommodation groove for accommodating an end portion of the compression spring.

6. The female terminal assembly according to claim 2, wherein the centering structure is positioned in a direction perpendicular to the insertion direction by a self-centering spring; and the connecting seat has a positioning hole, the female terminal has a positioning rod inserted into the positioning hole, the self-centering spring is provided on and matched with the positioning rod, and an outer side of the self-centering spring is matched with a wall of the positioning hole.

7. The female terminal assembly according to claim 3, wherein the centering structure is positioned in a direction perpendicular to the insertion direction by a self-centering spring; and the connecting seat has a positioning hole, the female terminal has a positioning rod inserted into the positioning hole, the self-centering spring is provided on and matched with the positioning rod, and an outer side of the self-centering spring is matched with a wall of the positioning hole.

8. The female terminal assembly according to claim 4, wherein the centering structure is positioned in a direction perpendicular to the insertion direction by a self-centering spring; and the connecting seat has a positioning hole, the female terminal has a positioning rod inserted into the positioning hole, the self-centering spring is provided on and matched with the positioning rod, and an outer side of the self-centering spring is matched with a wall of the positioning hole.

9. The female terminal assembly according to claim 5, wherein the centering structure is positioned in a direction perpendicular to the insertion direction by a self-centering spring; and the connecting seat has a positioning hole, the female terminal has a positioning rod inserted into the positioning hole, the self-centering spring is provided on and matched with the positioning rod, and an outer side of the self-centering spring is matched with a wall of the positioning hole.

10. The female terminal assembly according to claim 1, wherein the centering structure is positioned in a direction perpendicular to the insertion direction by a self-centering spring; and the connecting seat has a positioning hole, the female terminal has a positioning rod inserted into the positioning hole, the self-centering spring is provided on and matched with the positioning rod, and an outer side of the self-centering spring is matched with a wall of the positioning hole.

11. The female terminal assembly according to claim 10, wherein the positioning rod is exposed and forms an external port on a rear side of the connecting seat; and a central portion of the positioning rod forms a communication passage in communication with a port of the female terminal.

12. The female terminal assembly according to claim 11, wherein the female terminal is provided with a guide hole for guiding an insertion of the male terminal; and the positioning rod is threadedly connected to a locking nut on the rear side of the connecting seat.

13. The female terminal assembly according to claim 12, wherein the number of the port of the female terminal is two, the two ports of the female terminals are arranged on left and right sides in parallel, the number of the positioning rod of the female terminal is two, and the two positioning rods corresponds to the two ports of the female terminal, respectively; and two elastic devices are arranged at each of the left and right ends of the connecting seat to be in a rectangular distribution.

14. A connector, comprising a male terminal and the female terminal assembly according to claim 1, wherein the male terminal is connected to in an insertion manner and engaged with the female terminal of the female terminal assembly.

* * * * *